INVENTORS
GARTH H. WILSON
ROBERT T. JENKINS

BY Roger S. Borovoy
ATTORNEY

SCHOTTKY-BARRIER DIODE PROCESS AND DEVICES
Filed Jan. 10, 1969 2 Sheets-Sheet 2
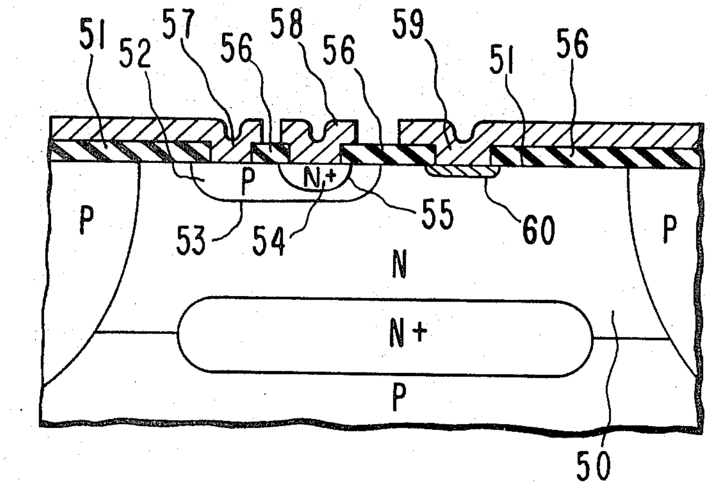
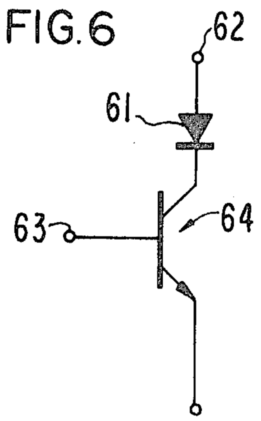
FIG.6
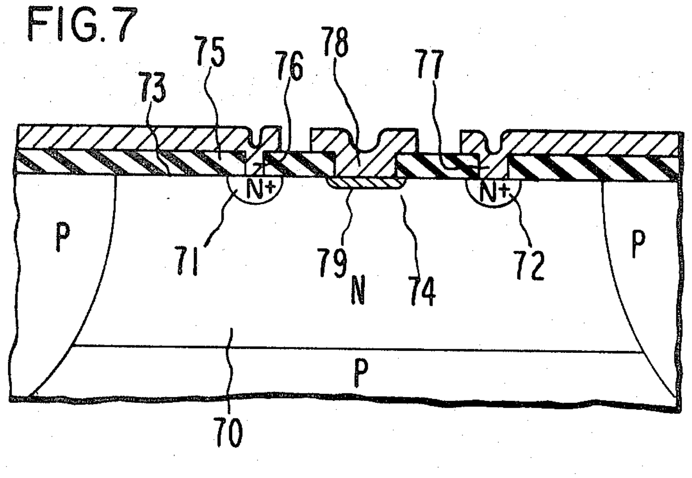
FIG.7
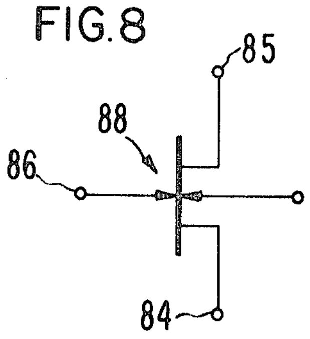
FIG.8
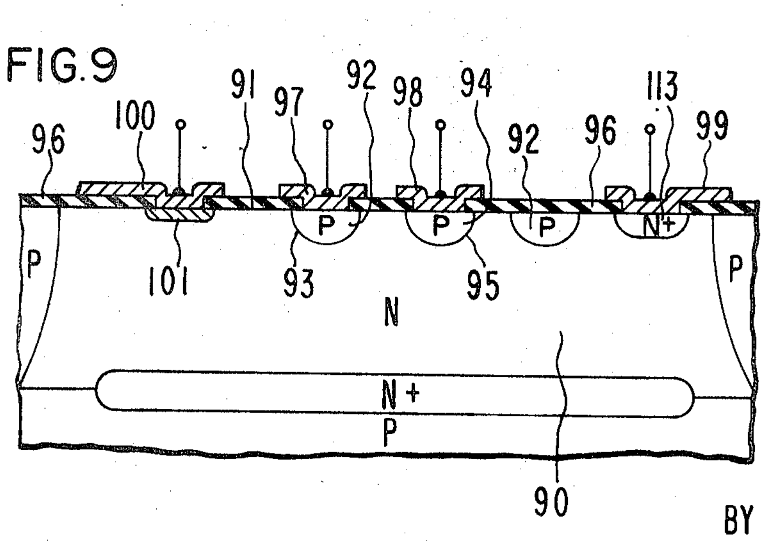
FIG.9
FIG.10
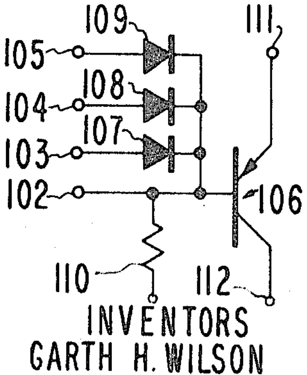
INVENTORS
GARTH H. WILSON
ROBERT T. JENKINS
BY Roger S. Borovoy
ATTORNEY United States Patent Office 3,623,925
Patented Nov. 30, 1971

3,623,925
SCHOTTKY-BARRIER DIODE PROCESS AND DEVICES

Robert T. Jenkins, Pasadena, and Garth H. Wilson, Los Altos, Calif., assignors to Fairchild Camera and Instrument Corporation, Syosset, N.Y.

Filed Jan. 10, 1969, Ser. No. 790,318
Int. Cl. H01l 7/44
U.S. Cl. 148—188 14 Claims

ABSTRACT OF THE DISCLOSURE

A Schottky-barrier diode capable of exhibiting superior reverse-bias operating characteristics and particularly suitable for large-scale integration can be fabricated by a method compatible with standard semiconductor processing techniques. Briefly, a highly conductive metallic layer overlying a region of semiconductor material is heated to a temperature sufficient to enable solid-state diffusion to occur between the semiconductor and metal, but below the eutectic point of both. A metal-semiconductor junction is thereby formed, wherein the junction lies below the original surface of the semiconductor region but has an edge at the surface, and unwanted impurities are prevented from interfering with operation.

BACKGROUND OF THE INVENTION

Field of the invention

This invention relates to a Schottky-barrier diode structure and process for making it. More particularly, this invention relates to an integrated circuit having a Schottky-barrier diode as one of the circuit elements. The processing steps for forming the Schottky-barrier diode may be a portion of an overall process for fabricating an entire integrated circuit.

Description of the prior art

A Schottky-barrier diode generally comprises a conductive metal making rectifying contact to a semiconductor material with a metal-semiconductor junction formed therebetween. A number of circuit advantages are provided when one or more Schottky-barrier diodes are used in conjunction with various integrated circuit configurations, especially in switching and radio-frequency applications. A characteristic of the metal-semiconductor junction of a Schottky-barrier diode is that minority carriers are not injected into the semiconductor portion during the forward-bias condition. As a result, the metal-semiconductor junction does not have an excess of minority carrier charges stored therein. By comparison, with a PN junction (the junction between two regions of semiconductor material of opposite polarity) minority carriers are injected into one or both of the semiconductor portions. When the bias voltage is suddenly changed from forward to reverse bias, current flows as long as there are stored minority carriers available for collection. Thus at sufficiently rapid switching times, the stored charge provides current flow in what is normally the nonconducting direction. The metal-semiconductor junction, however, does not depend upon minority carriers for its operation; consequently, the switching speed is much faster compared to that of the PN junction.

In the prior art, various techniques and combinations of material have been used to form the metal-semiconductor junction. In general, a metal layer is formed upon an exposed semiconductor surface so as to form a junction therebetween. Extreme care, however, must be exercised to keep the surface of the semiconductor material clean before forming the metal layer. Unwanted contamination beneath the metal and the semiconductor layer may detrimentally affect the electrical characteristics of the junction, thereby rendering the device unacceptable for many applications. Referring to FIG. 1, typical voltage-current characteristics are shown for forward and reverse-bias operation of a diode. When reverse-bias voltage is applied to the diode (indicated on the graph by a negative voltage) it is desirable that little current flow when the diode is operated below its breakdown voltage. However, in many prior-art devices (as indicated by curve 1 of FIG. 1), current is able to flow between the zero voltage point 5 and the breakdown voltage point 7, and this flow of current increases as the reverse-bias voltage increases. Unwanted current flow before breakdown is referred to as leakage current. One element causing leakage current is the contamination found between, within, and along the metal-semiconductor junction. To prevent unwanted contamination, one of the prior-art practices has been to clean the surface of the semiconductor material, such as silicon, using a solution of hydrofluoric acid and water. The surface is then kept immersed in methyl alcohol until the metal layer is to be formed thereupon. This technique, when used in conjunction with other semiconductor processing steps, is inconvenient. Moreover, the results are often unpredictable, particularly when a period of time has elapsed between the original cleaning step and the metal formation step.

Another prior-art technique comprises etching the surface to remove contaminants, and then immediately performing further processing steps. Still another technique comprises cleavage in a vacuum to remove surface contamination, and then keeping the device in a vacuum so that further processing can be performed thereon. Both the etching and the vacuum cleavage approaches are inconvenient and difficult to incorporate with other semiconductor processing techniques.

Although it is not fully known what all the factors are which comprise contamination, it is believed that some of the contamination consists of minute particles of oxide left on the semiconductor surface after a portion of the protective layer is removed. Some of these oxide particles remain even after the cleaning and rinsing steps. Thus, an approach is needed that further reduces contamination along the exposed part of the semiconductor layer prior to forming a metal layer thereupon that is compatible with semiconductor processing techniques, preferably without requiring additional processing steps. Furthermore, although various kinds of metals have been used in the prior art to form the metal-semiconductor junction, it is particularly advantageous that the metal selected also be capable of forming the interconnection layers between active regions, for example, for integrated-circuit applications.

SUMMARY OF THE INVENTION

The Schottky-barrier diode structure of the invention can be formed by a process wherein the reverse-bias characteristics of the metal-semiconductor junction approach that of an ideal diode (shown by curve 2 of FIG. 1). Harmful contamination along and in the vicinity of the metal-semiconductor junction and unwanted leakage current resulting therefrom are eliminated. Furthermore, the process of the invention allows the same metal used for the interconnection layers to comprise one portion of the metal-semiconductor junction, thereby further reducing the processing steps needed. The structure can be readily integrated and can be applied to integrated-circuit configurations, large-scale integration, complex arrays, and other types of solid-state devices, without increasing the number of process steps already used in integrated-circuit fabrications. Furthermore, the structure is particularly suitable for switching applications and for radio-frequency applications, such as above one megahertz.

Briefly, the structure of the invention for a Schottky-barrier diode comprises a layer of semiconductor material of one conductivity type having a surface. Overlying the surface is a layer of protective material formed to expose a portion of the semiconductor layer. A conductive metal overlies and adheres to the exposed semiconductor layer and forms a metal-semiconductor junction therebetween. The junction is located below the original planar surface of the semiconductor layer but has an edge at the surface.

The process of the invention for forming the Schottky-barrier diode having a metal-semiconductor junction comprises forming a protective layer over and adherent to a surface of a layer of semiconductor material of one conductivity type; removing a portion of the protective layer to expose a selected portion of the semiconducor surface; forming a layer of conductive metal upon and adherent to the exposed portion; heating the conductive metal and exposed semiconductor portion to a temperature and for a time period sufficient to enable solid-state diffusion of the semiconductor into the metal to occur, the temperature being less than the eutectic point of the metal and semiconductor material; and cooling the conductive metal and the semiconductor layer so that a metal-semiconductor junction is formed therebetween, the junction lying below the original semiconductor surface and having an edge at the surface.

BRIEF DESCRIPTION OF THE DRAWINGS

FIG. 5 is a simplified schematic drawing of a cross-section of a structure comprising another application of the invention wherein a Schottky-barrier diode is connected between the collector of a transistor and an output terminal.

FIG. 6 is a schematic circuit representation of the structure of FIG. 5.

FIG. 7 is a simplified schematic drawing of a cross-section of a structure comprising still another application of the invention wherein a Schottfiy-barrier diode is used for the gate of a junction field-effect transistor.

FIG. 8 is a schematic circuit representation of the structure of FIG. 7.

FIG. 9 is a simplied schematic drawing of a cross-section of a structure comprising yet another application of the invention wherein each of the input diodes to a logic NOR gate comprise the Schoty-barrier structure of the invention.

FIG. 10 is a schematic circuit representation of the structure of FIG. 9.

DESCRIPTION OF THE PREFERRED EMBODIMENTS

Figure 2:
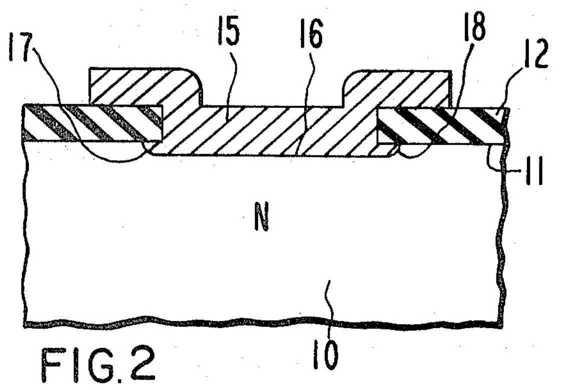
FIG. 2 is a simplified schematic drawing of a cross-section of the Schottky-barrier diode structure of the invention wherein the metal-semiconductor junction lies below the surface of the semiconductor layer and is formed so that an edge of the junction is at the surface.

Referring to FIG. 2, the basic Schottky-barrier diode structure of the invention comprises a layer of semiconductor material 10 of one conductivity type having a surface 11. For negative-type conductivity, indicated in FIG. 2 by the letter N, the impurity concentration of layer 10 is not greater than approximately $10^{17}$ dopant atoms per cubic centimeter. The conductivity of layer 10 can also be positive-type, with appropriate impurity concentration, depending upon the metal-semiconductor combination selected. Selection of the material to form the semiconductor layer 10 must be such that the material chosen is compatible with the metal selected to form the semiconductor-metal junction hereinafter described. Silicon is a particularly convenient material for the semiconductor layer 10.

Overlying the surface 11 is a protective layer 12, which is formed to expose a portion of the semnconductor layer 10 and functions to keep the surface free from harmful contamination. The protective layer 12 may comprise and oxide and in the case where silicon is the semiconductor layer 10, layer 12 comprises an oxide of silicon, such as silicon dioxide. A contact 15 comprising a conductive metal compatible with semiconductor material 10 and protective layer 12 is located upon and adherent to the exposed portion of the semiconductor layer 10 and forms a metal-semiconductor junction 16 therewith. For silicon having a negative-type conductivity, a particularly suitable material for contact 15 comprises aluminum. Although located below the original surface 11 (such as at a depth of approximately 2000 angstroms) the junction 16 has an edge at the surface 11. By the process of the invention hereafter described, harmful surface contamination is removed from the region of the junction 16. Furthermore, the junction 16 has a curved corner 17 and 18, which provide for a uniform distribution of an electrical field applied to the junction and prevent unwanted concentration of electrical field at a particular point, thereby resulting in better reverse-bias breakdown voltage characteristics compared to prior-art metal-semiconductor junctions without the curved corner. Moreover, the metal contact 15 may overlie a portion of the protective layer 12, which in turn overlies an edge of the junction 16 appearing at the surface 11, thereby acting as a field plate. When a potential is applied to contact 15, the concentration of an electrical field in the vicinity of the corner 17 or 18 is further reduced and the potential breakdown voltage correspondingly increased. For a further discussion of the use of a field plate to increase breakdown voltage, reference should be made to U.S. patent application No. 607,039, filed Jan. 3, 1967, and assigned to the same assignee as this invention.

The process of the invention for forming a Schottky-barrier diode having a metal-semiconductor junction is compatible with standard semiconductor processing techniques used to form solid-state devices. In such processes, such as the planar process, typically a layer of protective material is formed over a layer of semiconductor material of one conductivity type. To this semiconductor layer, the process of the invention is applied. Referring to FIG. 2, a portion of the overlying protective layer 12 is removed, suitably using standard photoresist techniques, to expose a portion of the semiconductor layer 10. Next, a cleaning solution is applied to the exposed portion to remove as much contamination as possible, which typically is in the form of small particles of oxide left there following removal of a portion of the oxide protective layer 12. With silicon as the semiconductor layer 10 and an oxide of silicon as the protective layer 12, the cleaning solution may comprise a mixture of ten parts water to one part hydrofluoric acid by volume into which the exposed area is dipped. The solution is selected so as not to be harmful to the semiconductor layer 10; it merely cleans away contamination around the exposed portion of the semiconductor layer 10. Next, a rinsing solution is applied to remove the cleaning solution. For the cleaning mixture mentioned above, the rinsing solution may comprise deionized $H_2O$.

Onto this clean exposed portion is deposited conductive metal 15. A convenient deposition technique comprises evaporating metal onto the exposed portion using an electron beam. Preferably, the conductive metal is of a type that can be also be used to form interconnection layers.

Following deposition, the metal 15 and the semiconductor layer 10 in the vicinity of the exposed portion are heated to a temperature and for a time period sufficient to cause solid-state diffusion of a portion of the semiconductor layer 10 into the metal 15 so that the metal-semiconductor junction 16 of the invention is formed. Solid-state diffusion is a process wherein a portion of one material dissolves into a portion of another material at a temperature that is less than the eutectic point of the two materials. Because the temperature is lower than the eutectic point, both materials are in a solid state rather than in a liquid state. With silicon as the semiconductor material 10 and aluminum as the metal 15, the eutectic point is at a temperature of approximately 577° C. Preferably, using silicon and aluminum, the heat treatment occurs at a temperature not greater than 565° C. At this temperature, a convenient time period for solid-state diffusion of silicon into the aluminum is approximately five minutes. Also, to avoid the need for an inconveniently long time period for sufficient heat treatment, it is preferable that the temperature be greater than approximately 400° C. Whatever semiconductor material and metal are selected, however, the former must be capable of solid-state diffusion into the latter at a point below the eutectic point of both. It shall be appreciated that during the heat treatment step, some metal dissolves into the semiconductor material. However, the diffusion rate of semiconductor material into the metal must be substantially greater than the diffusion rate of the latter into the former, thus ensuring that the amount of semiconductor material dissolved into the metal is substantially greater than the amount of metal dissolved into the semiconductor material.

Preferably, the heat treatment is performed in an inert ambient, such as nitrogen. As a portion of the semiconductor layer 10 dissolves into the metal 15, contamination along the surface of the exposed layer 10 is eliminated, and the metal 15 fills the space left by the dissolved semiconductor material.

Exactly how the contamination is eliminated is not fully understood. However, it is believed that when a portion of the semiconductor layer 10 dissolves into the metal contact space 15, contamination in the form of oxide particles also dissolves. In the case of silicon as the semiconductor material and aluminum as the contact metal, it is believed that the oxide portion of the silicon oxide reacts with the aluminum to form aluminum oxide. Furthermore, as the silicon dissolves into the aluminum, the aluminum fills the space left by the dissolved silicon. Thus, the metal-semiconductor junction 16 itself is located below the original surface and away from the site of the surface contamination.

Figure 1:
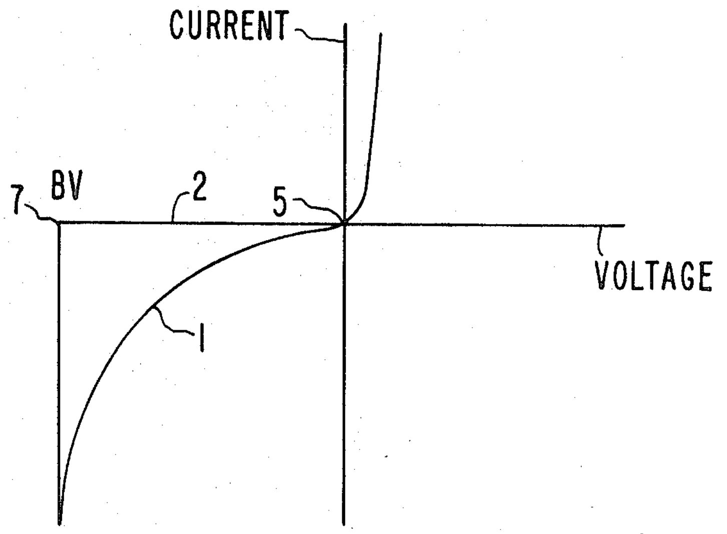
FIG. 1 is a graph showing the forward and reverse bias characteristics of a prior-art Schotty-barrier diode (curve 1) and that of an ideal diode (curve 2) wherein contamination along the metal-semiconductor junction has been eliminated, and unwanted leakage current reduced.

The depth of the metal-semiconductor junction 16 is determined by the original thickness of the overlying metal and by the temperature and time period of the solid-state diffusion. A typical depth for a metal-semiconductor junction comprising aluminum and silicon is 2000 angstroms. With the process of the invention wherein contamination in the vicinity of the metal-semiconductor junction 16 is eliminated and unwanted reverse-bias leakage current is reduced, a Schottky-barrier diode is provided having characteristics approaching the ideal as indicated by curve 2 in FIG. 1, whereby during reverse-bias operation, unwanted current does not flow until the applied reverse-bias voltage reaches the point of breakdown.

Figure 4:
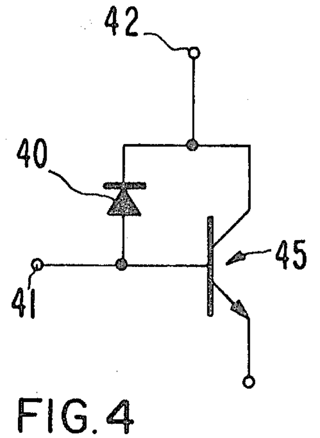
FIG. 4 is a schematic circuit representation of the structure of FIG. 3.
Figure 3:
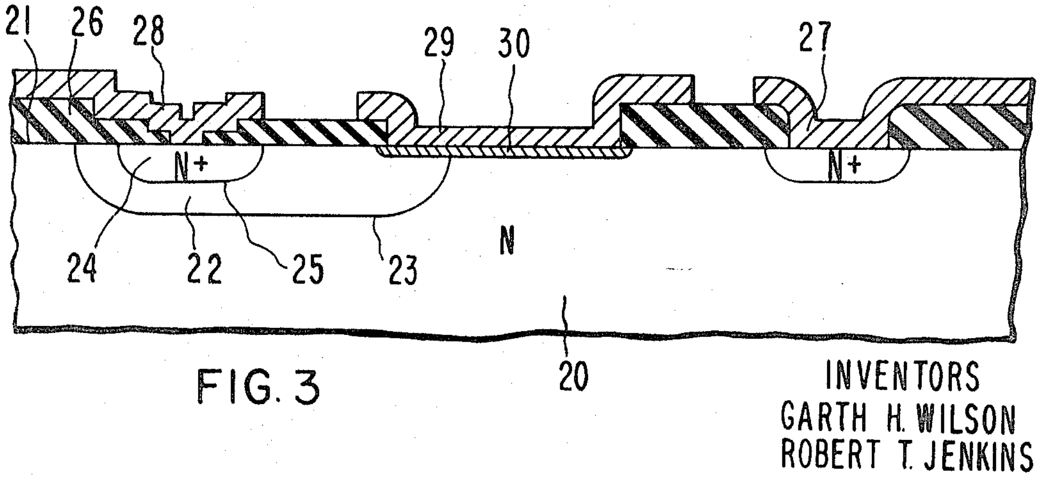
FIG. 3 is a simplified schematic drawing of a cross-section of a structure comprising one application of the invention wherein a Schottky-barrier diode is connected in parallel with the collector-base junction of a transistor.

Referring to FIG. 3, a semiconductor structure incorporating the Schottky-barrier diode of the invention comprises a transistor having its collector-base junction in parallel with the diode of the invention. In this structure, a layer of semiconductor material 20 (such as silicon) of one conductivity type (such as of negative polarity) has a surface 21. A first region 22 of an opposite conductivity type (such as of positive polarity) is located within the layer 20 and forms a first PN junction 23 therewith, the junction 23 having an edge at the surface 21. A second semiconductor region 24 of one conductivity type is disposed within the first region 22 and forms a second PN junction 25 therewith, the second junction 25 having an edge at the surface 21. A layer of protective material 26 overlies the surface and is formed to expose a portion of the semiconductor layer 20, the first region 22, and the second region 24 making contacts thereto. The exposed portion of the first region 22 extends to include an exposed portion of the semiconductor layer 20. Ohmic contact is made to the semiconductor layer 20 and second region 24 by respective contacts 27 and 28 located upon and are adherent to the respective exposed portions of layer 20 and second region 24. It has been found that with N-type silicon as the semiconductor layer 20, when the impurity concentration of layer 20 in the vicinity of contact 27 and of the second region 24 is not less than approximately $10^{18}$ dopant atoms per cubic centimeter, ohmic contact to contacts 27 and 28 is ensured. Contacts 27 and 28 comprise a conductive metal, such as aluminum. Ohmic contact is made to the exposed portion of the first region 22 by an overlying third contact 29. However, third contact 29 also makes rectifying contact to the adjacent exposed portion of the semiconductor layer 20, forming a metal-semiconductor junction 30 therebetween. The metal-semiconductor junction 30 is located below the surface 21 but has an edge at that surface. In this embodiment, the second region 24 may be referred to as the emitter, the semiconductor layer 20 as the collector, and the first region 22 as the base of a transistor. Also, contact 29 is the anode and layer 20 is the cathode of a Schottky-barrier diode. Referring to FIG. 4, an electrical schematic drawing for the structure of FIG. 3 is shown. For purposes of description, the transistor 45 is shown as an NPN type, with a diode 40 reverse biased between the base terminal 41 and the collector terminal 42. However, a PNP transistor could be used instead, with appropriate changes in polarity and in the bias of the diode 40, without departing from the scope of the invention. To fully appreciate the advantage of including the Schottky-barrier diode of the invention in the circuit of FIG. 4, operation with and without the diode 40 may be compared. For example, without the diode 40, when a sufficient voltage of positive polarity is applied to the base of NPN transistor 45 via terminal 41, the transistor 45 turns on and then saturates, with the collector-base junction forward biased. During saturation an appreciable amount of minority-carrier charge is stored in the collector region thereof. To turn off the transistor 45 a, voltage having a negative polarity is applied to the base via terminal 41. However, the charge stored in the collector and base regions must recombine or be collected by the now reverse-biased collector-base junction before the transistor can switch from the on to the off condition. The period of time needed to change from the on to the off condition is referred to as the switching time; for many applications it is desirable that the switching time be as short as possible.

By comparison, incorporating the Schottky-barrier diode of the invention as shown in the structure of FIG. 3 and in the schematic of FIG. 4, both the collector-base PN junction of transistor 45 and the Schottky-barrier diode 40 become forward biased when a positive voltage is applied to terminal 41. The diode 40 has a lower turn-on voltage (approximately 0.3 volt) compared to that of the transistor 45 (approximately 0.6 volt). Consequently, the diode 40 limits forward bias on the collector-base junction to a few tenths of a volt, diverting current applied to terminal 41 away from the base of transistor 45, thereby preventing appreciable minority-carrier charge storage from occurring in the collector and base regions of transistor 45. This effect greatly reduces the time required to switch transistor 45 from the on to the off condition. If the same metal used to form the interconnection layers is also selected to form the contact 29, which comprises one portion of the metal-semiconductor junction 30, then no additional processing is needed for fabrication of the junction 30.

Referring to FIG. 5, the Schottky-barrier diode of the invention is applied to a semiconductor structure wherein the diode is coupled between the collector of a transistor and an output terminal. Briefly, the structure comprises a layer 50 of semiconductor material (such as silicon), the layer 50 having a surface 51 and being of one conductivity type (such as of negative polarity). A first region 52 of opposite conductivity type (such as of positive polarity) is located within the semiconductor layer 50 and forms a first PN junction 53 therewith, the junction 53 having an edge at the surface 51. Located within the first region 52 is a second region 54 of the one conductivity type and forming a second PN junction 55 therewith, the second junction 55 having an edge at the surface 51. A protective layer 56 (suitably an oxide) overlies the surface 51 and is formed to expose a portion of the first region 52, second region 54, and semiconductor layer 50, so that contact can be made thereto. Ohmic contact is made to the exposed portions of first and second regions 52 and 54 by respective contacts 57 and 58, which comprise a conductive metal, such as aluminum. First region 52 forms the base, second region 54 forms the emitter, and the semiconductor layer 50 forms the collector of a transistor. A third contact 59 overlies the exposed portion of semiconductor layer 50 to make rectifying contacts thereto, and a metal-semiconductor junction 60 is formed between the third contact 59 and the semiconductor layer 50. The junction 60 lies below but has an edge at the original surface 51. The structure of FIG. 5 is particularly advantageous for protecting a transistor from the harmful effect of a high, potentially destructive current flowing across the base-collector junction, under some abnormal transistor operating condition. A schematic representation of the circuit for the structure of FIG. 5 is shown in FIG. 6.

The advantages of using the Schottky-barrier diode of the invention in this structure can be appreciated by considering the circuit of FIG. 6 with and without the diode. First, without the diode, if the load on the output (or collector) terminal 62 is of a low impedance and a high positive voltage applied to the input (or base) terminal 63 of NPN transistor 64, thereby causing a large voltage differential between terminals 62 and 63, the base-collector PN junction is forward biased and a large current can flow across the junction. Too large a current, such as approximately one ampere, can destroy the collector-base junction, even if the impedance of the emitter current is high enough to prevent high current from flowing across the emitter-base junction. By comparison, with the Schottky-barrier diode 61 of the invention incorporated into the circuit as shown in FIG. 6, the diode 61 prevents the flow of current from the base to the collector terminal 62, and thus protects the base-collector junction of transistor 64. This particular application is especially convenient when used in the input stage of a differential amplifier, which often must withstand a large positive common-mode voltage applied to the input terminal. The Schottky-barrier diode of the invention as used in the circuit of FIG. 6 provides the additional advantage in that the diode can be located in the same isolation pocket as the transistor. The need for an additional isolation pocket (as in the case of a PN junction diode) is eliminated, which thereby increases the potential density of an integrated circuit, a complex array, or a large-scale integration device comprising the structure of FIG. 5, or its equivalent. Furthermore, although the diode and the transistor are in the same isolation pocket, the metal-semiconductor junction 60 precludes any parasitic or lateral PNP action from occurring, and eliminates the problem of minority carriers being injected into the semiconductor layer 50.

In yet another application, the Schottky-barrier diode of the invention is incorporated into a junction field-effect transistor structure, as shown in FIG. 7. The structure comprises a layer of semiconductor material 70 (such as silicon) of one conductivity type (such as of negative polarity). First and second regions 71 and 72 of the one conductivity type, but of a higher impurity concentration (such as approximately $10^{19}$ dopant atoms per cubic centimeter) and have thus increased conductivity compared to layer 70, are located within and extend from the surface 73 of layer 70, and are spaced apart to form a channel region 74 therebetween. A layer 75 of protective material, such as an oxide, overlies the surface 73 and is formed to expose a portion of regions 71 and 72. Overlying the exposed portion of regions 71 and 72 and making ohmic contact thereto are respective contacts 76 and 77 comprising conductive metal (such as aluminum). Protective layer 75 is also formed to expose a portion of the channel region 74 approximately midway between the two regions 71 and 72. A contact 78 comprising conductive metal (such a aluminum) is located upon and adherent to this exposed portion and makes rectifying contact to the semiconductor layer 70. Between the metal contact 78 and the semiconductor layer 70 is a metal-semiconductor junction 79, which lies below the surface 73 but has an edge thereat. Regions 71 and 72 comprise the source and drain of a field-effect transistor and metal contact 78 comprises the gate. When a suitable voltage differential is applied between regions 71 and 72, and suitable bias signal (such as zero volts) is applied to the gate 78, conduction occurs across the channel region 74. However, in the case where layer 70 and regions 71 and 72 are of N-type conductivity, a negative signal applied to the gate 78 causes the width of the channel region 74 to become more narrow, thereby increasing the resistance of the signal path between the source and drain regions 71 and 72.

In the prior art, devices have used a diffused-gate structure in which the gate comprises a region of opposite conductivity type located within the channel region 74 between the two regions 71 and 72 and forming a PN junction with the semiconductor layer 70. This gate region functions to control the conductance of the channel region 74. With the structure shown in FIG. 7, however, the Schottky-barrier diode of the invention has been incorporated as the gate. Assuming that the conductivity type of the layer 70 and of regions 71 and 72 is of negative polarity, the semiconductor layer 70 forms the cathode and the metal 78 forms the anode of the diode.

FIG. 8 provides a schematic circuit diagram for the structure of FIG. 7. A voltage differential applied across terminals 84 and 85 with approximately zero voltage applied to terminal 86 causes conduction to take place between the source and drain of the field-effect transistor 88. If a negative signal is applied to the gate of transistor 88 via terminal 86, the resistance of the channel region in transistor 88 increases, thereby reducing the amount of conduction occurring between the source and the drain thereof. However, if a positive signal is applied to terminal 84 or 85, and if a negative signal is applied to terminal 86 that is sufficiently high to cause a substantial voltage differential, unwanted conduction because of injected minority carrier in the case of a prior-art diffused-gate structure may take place between the drain or source and the gate. By comparison, with the Schottky-barrier diode structure, because minority carrier injection is negligible, the problem of positive feedback between components in the same isolation pocket (as in the case of the PN junction due to minority carriers) is eliminated. Other advantages are provided by this structure over prior-art devices using a PN-type junction gate. First, the Schottky-barrier gate has a depth of approximately one-half micron or less, compared to a typically one-to-four micron depth of a prior-art PN gate. With a shallower junction, the Schottky-barrier diode gate provides a wider channel region in the zero-bias condition, and for devices of approximately the same dimensions the initial resistance of the signal path across the channel region between the source and drain is correspondingly lower. Conseuqently, a junction FET with a Schottky-barrier diode gate has a low initial resistance and can operate with higher current compared to a field-effect transistor of equal lateral dimensions having a PN junction gate. Second, the Schottky-barrier diode gate reduces the problem of possible misalignment by eliminating the need for two oxide cuts, a process usually required when using the PN junction gate. Third, the length of the Schottky-barrier diode gate can be shorter than that of the PN gate; consequently, because the gate capacitance is a function of gate area, the shorter Schottky-barrier gate has a smaller area and thus less capacitance, and therefore operates at higher frequency than the PN junction type gate. Fourth, compared to a device having a diffused-gate structure, the metal gate eliminates the effect of a distributed gate resistance, and thereby further improves high-frequency performance.

Referring to FIG. 9, a structure for a diode-transistor logic NOR gate incorporating the Schottky-barrier diode of the invention is shown. The structure comprises a semiconductor layer 90 (such as silicon) of one conductivity type (such as of negative polarity) and having a surface 91. Located in layer 90 is first region 92 of opposite conductivity type which forms a first PN junction 93 therewith, the junction 93 having an edge at the surface 91. A second region 94, spaced apart from the first region 92, is also disposed within the semiconductor layer 90. The second region 94 is of opposite conductivity type and forms a second PN junction 95 with the semiconductor layer 90, the second junction 94 having an edge at the surface 91. A contact region 113, spaced apart from the first and second regions 92 and 94, is located in the semiconductor layer 90 and extends from the surface 91 thereof. Contact region 113 is of the one conductivity type and preferably has an impurity concentration of not less than approximately $10^{18}$ dopant atoms per cubic centimeter. A protective layer 96 overlies the surface 91 and is formed to expose a portion of the first region 92, the second region 94, and the semiconductor layer 90, so that separate ohmic contact may be made to each. Overlying and making ohmic contact to the exposed portion of the first region 92, the second region 94, and the contact region 113 are respective metal contacts 97, 98, and 99, which comprise conductive metal (such as aluminum). The protective layer 96 is also formed to expose a plurality of separate portions of the semiconductor layer 90 so that rectifying contact can be made thereto. Upon each of the plurality of exposed portions of layer 90 is formed a contact 100 comprising conductive metal, such as aluminum. Located between the semiconductor layer 90 and the metal contact 100, a metal-semiconductor junction 101 lies beneath the original surface 91 but has an edge at the surface 91. Thus, a plurality of Schottky-barrier diodes are formed in the isolation pocket. Preferably, the impurity concentration of the semiconductor layer 90 in the vicinity of each of the plurality of rectifying contacts is not greater than $10^{17}$ dopant atoms per cubic centimeter.

A simplified schematic circuit diagram for the structure of FIG. 9 is shown in FIG. 10. A plurality of input terminals 102 through 105 are coupled to the base of transistor 106. Each of these input terminals 103 through 105 has a respective diode 107 through 109 coupled between the terminal and the base, and forward biased toward the base. Although the transistor 106 is shown as a PNP transistor, it could be an NPN with the diodes 107 through 109 forward biased away from the base. For proper operation, a resistor 110 is coupled between input terminal 102 and a source of negative voltage. When a positive voltage is applied to the emitter of transistor 106 via terminal 111, a negative voltage is applied to the collector of transistor 106 via terminal 112, and a negative signal is applied to the base of the transistor 106 via terminal 102, conduction across transistor 106 occurs. Note, however, that a positive voltage applied to the anode of any of the diodes 107 through 109 via respective terminals 103 through 105 or to the base via terminal 102 causes the transistor 106 to turn off, and conduction stops.

The structure of FIG. 9 incorporating the Schottky-barrier diode of the invention may be appreciated more fully by comparing it with prior-art devices. Before this invention, each of the diodes for the input terminals of a typical diode-transistor NOR gate usually comprised a PN junction, located between two regions of different conductivity type. In order to prevent unwanted injection of minority carriers into the main semiconductor layer, anl to prevent potential problems (such as slow turn off due to charge storage) arising as a result of the close proximity of the diode junction and the collector region when they are in the same isolation pocket, a common prior art practice has been to form the diode junctions not in the same isolation pocket as the transistor but in one or more separate pockets. However, this approach requires an unduly large amount of substrate area, and therefore is unacceptable for large-scale integration. With the structure of FIG. 9, however, the problem of minority carriers is eliminated and thus the metal-semiconductor junction can be in the same isolation pocket as the transistor. By incorporating the structure of the invention, a considerable saving in substrate area is achieved, a desirable feature for large-scale integration.

While the structure of the invention has been described in reference to specific embodiments, the scope of the invention is not limited to these embodiments, but is applicable to numerous other embodiments which will be readily apparent to one skilled in the art, particularly in switching applications, and in application requiring high-frequency operation (above one megahertz).

What is claimed is:

1. A process for improving reverse-bias operation of a Schottky-barrier metal-semicondctor junction by removing unwanted contamination therefrom, the metal comprising aluminum and the semiconductor comprising silicon, the process comprising:

heating the junction to less than 565° C., a temperature less than the eutectic point of the metal and semiconductor material forming the junction, for a period of time sufficient to enable solid-state diffusion of a portion of the semiconductor material into the metal, with a portion of the metal filling the void left by the diffused semiconductor material; and, cooling the junction after sufficient solid-state diffusion has occurred, whereby leakage current during reverse bias operation of the junction is substantially reduced below that of a similar junction without the solid-state diffusion step.

2. The process recited in claim 1 wherein the semiconductor material is of *n* type conductivity, and the impurity concentration thereof in the vicinity of the junction is less than approximately $10^{17}$ dopant atoms per cubic centimeter.

3. The process recited in claim 1, wherein the semiconductor material is of p type conductivity.

4. A process for forming a Schottky barrier diode upon a layer of semiconductor material comprising silicon of one conductivity type having a surface, with a protective layer overlying a portion of the surface, the steps comprising:

removing a portion of the protective layer to expose a selected portion of the semiconductor layer;

depositing conductive metal comprising aluminum at least upon and adherent to the exposed semiconductor layer;

heating the conductive metal and the exposed semiconductr layer to less than 565° C. a temperature less than the eutectic point of the metal and semiconductor layer for a period of time sufficient to enable solid-state diffusion of a portion of the semiconductor layer into the conductive metal, with a portion of the metal filling the void left by the diffused semiconductor layer; and cooling the conductive metal and the semiconductor layer so that a Schottky-barrier metal-semiconductor junction is formed therebetween.

5. The process recited in claim 4 wherein the metal-semiconductor junction is located below the original semiconductor surface but has an edge at the surface.

6. The process recited in claim 5 wherein the semiconductor layer is of n type conductivity and the impurity concentration of the semiconductor layer in the vicinity of the metal-semiconductor junction is less than $10^{17}$ dopant atoms per cubic centimeter.

7. The process recited in claim 5 wherein the depositing step comprises evaporating aluminum onto the exposed semiconductor layer using an electron beam.

8. The process recited in claim 5 wherein the aluminum thickness is between approximatley 3000 angstroms and 10 microns.

9. The process recited in claim 5 wherein the temperature is greater than 400° C.

10. The process recited in claim 4 wherein the heating step is performed in an inert atmosphere.

11. The process recited in claim 10 wherein the inert atmosphere comprises nitrogen.

12. The process recited in claim 4 further defined by the additional step of cleaning the exposed semiconductor layer of unwanted contamination before the step of metal deposition.

13. The process recited in claim 12 wherein the cleaning step comprises applying a first solution to dissolve unwanted contamination around the exposed surface and then applying a second solution to rinse the exposed semiconductor layer and dilute and remove the first solution.

14. The process recited in claim 13 wherein said first solution comprises a mixture of ten parts water to one part hydrofluoric acid by volume, and the second solution comprises de-ionized water.

References Cited

UNITED STATES PATENTS

| | | | |
|---|---|---|---|
| 3,264,159 | 8/1966 | Batdorf et al. | 148—1.5 |
| 3,347,701 | 10/1967 | Yamagishi et al. | 117—106 |
| 3,413,157 | 11/1968 | Kuiper | 148—187 |
| 3,450,957 | 6/1969 | Saxena et al. | 317—234 |

L. DEWAYNE RUTLEDGE, Primary Examiner

J. M. DAVIS, Assistant Examiner

U.S. Cl. X.R.

29—576; 148—1.5; 317—235